US008004331B2

(12) United States Patent
Li et al.

(10) Patent No.: US 8,004,331 B2
(45) Date of Patent: Aug. 23, 2011

(54) CMOS CLOCK RECEIVER WITH FEEDBACK LOOP ERROR CORRECTIONS

(75) Inventors: Yunchu Li, Andover, MA (US); Shawn Kuo, Medford, MA (US)

(73) Assignee: Analog, Devices, Inc., Norwood, MA (US)

( * ) Notice: Subject to any disclaimer, the term of this patent is extended or adjusted under 35 U.S.C. 154(b) by 80 days.

(21) Appl. No.: 12/475,866

(22) Filed: Jun. 1, 2009

(65) Prior Publication Data

US 2010/0301913 A1    Dec. 2, 2010

(51) Int. Cl.
*H03K 3/017* (2006.01)
(52) U.S. Cl. ...................................................... 327/175
(58) Field of Classification Search ............... 327/78, 327/79, 175
See application file for complete search history.

(56) References Cited

U.S. PATENT DOCUMENTS

| | | | | |
|---|---|---|---|---|
| 5,182,476 A * | 1/1993 | Hanna et al. | ............... | 327/362 |
| 5,572,158 A * | 11/1996 | Lee et al. | ............... | 327/175 |
| 6,169,434 B1 * | 1/2001 | Portmann | ............... | 327/175 |
| 6,323,706 B1 * | 11/2001 | Stark et al. | ............... | 327/175 |
| 6,411,145 B1 * | 6/2002 | Kueng et al. | ............... | 327/175 |
| 6,670,838 B1 * | 12/2003 | Cao | ............... | 327/175 |
| 6,853,225 B2 * | 2/2005 | Lee | ............... | 327/158 |
| 6,900,681 B2 * | 5/2005 | Takano | ............... | 327/175 |
| 6,963,235 B2 * | 11/2005 | Lee | ............... | 327/158 |
| 6,975,150 B2 * | 12/2005 | Panikkath et al. | ............... | 327/175 |
| 7,180,346 B2 * | 2/2007 | Lee | ............... | 327/175 |
| 7,199,634 B2 * | 4/2007 | Cho et al. | ............... | 327/175 |
| 7,202,722 B2 * | 4/2007 | Mahadevan et al. | ............... | 327/175 |
| 7,332,948 B2 * | 2/2008 | Park et al. | ............... | 327/175 |
| 7,501,870 B2 * | 3/2009 | Choi et al. | ............... | 327/175 |
| 7,579,890 B2 * | 8/2009 | Sohn | ............... | 327/175 |
| 7,733,143 B2 * | 6/2010 | Guo et al. | ............... | 327/175 |
| 7,863,957 B2 * | 1/2011 | Jang et al. | ............... | 327/175 |
| 2007/0146011 A1 * | 6/2007 | O'Mahony et al. | ............... | 326/93 |
| 2008/0197903 A1 * | 8/2008 | Humble | ............... | 327/175 |
| 2008/0272819 A1 * | 11/2008 | Cheng | ............... | 327/298 |
| 2010/0148835 A1 * | 6/2010 | Watarai | ............... | 327/175 |
| 2010/0164580 A1 * | 7/2010 | Boerstler et al. | ............... | 327/175 |

* cited by examiner

*Primary Examiner* — Lincoln Donovan
*Assistant Examiner* — William Hernandez
(74) *Attorney, Agent, or Firm* — Kenyon & Kenyon LLP

(57) ABSTRACT

A system for correcting duty cycle errors in a clock receiver that includes a differential amplifier having inputs for a pair of differential clock signals. A duty cycle error detector has inputs for a pair of amplified clock signals and an output for a duty cycle error correction signal. A signal conditioner is also provided with the differential amplifier having an input for the duty cycle error correction signal. Furthermore, the signal conditioner adjusts the differential clock signals in response to the duty cycle error correction signal. Also, a system for correcting cross point errors in a clock receiver that includes a differential amplifier having inputs for a pair of differential clock signal. A cross point error detector has inputs for a pair of amplified clock signals and an output for a cross point error correction signal. A signal conditioner is also provided with the differential amplifier having an input for the cross point error correction signal. Furthermore, the signal conditioner adjusts the differential clock signals in response to the cross point error correction signal.

22 Claims, 9 Drawing Sheets

300

400

500a

500b

600

700

800

900

1000

1100

1200

1300

1400

1500

1600

1700

1800

1900

2000

CMOS CLOCK RECEIVER WITH FEEDBACK LOOP ERROR CORRECTIONS

BACKGROUND

The present invention relates to clock receiver designs. Clock receivers can be used in high speed digital to analog converters, analog to digital converters, and clock distribution circuits which, in turn, are provided in integrated circuits. These high speed components typically operate in about the 1-5 GHz frequency range but can operate as low as 100 MHz. Performance of CMOS clock receivers can be severely impacted by duty cycle errors and cross point errors, which cause interference in the receiver such as phase noise, jitter, and frequency limit problems. Embodiments of the present invention address solutions to reduce duty cycle errors and cross point errors in CMOS clock receivers.

High speed clocked circuit systems often are driven by externally supplied clock systems. When circuit systems operate at clock speeds of 100 MHz-5 GHz or more, input clock signals usually are not provided as conventional square wave signals. Instead, the input clock signals often are differential signals that approximate sinusoids much closer than square waves. They often are "small swing" signals, having signal amplitudes that are smaller than the voltage sources ($V_{DD}$) present within the circuit systems. Moreover, the input clock signals cannot be guaranteed to have a 50% duty cycle; instead, the two phases $\Phi1$ and $\Phi2$ of a clock signal have different durations. FIG. 1 illustrates an example of differential signals with different duty cycles. From such inputs, it becomes a challenge for circuit designers to generate clock signal that provide rail-to-rail swings ($V_{DD}$ to ground) with a proper 50% duty cycle.

Designers of high speed circuit systems face other challenges from the sinusoidal clock inputs. For example, some circuit systems require a full swing CMOS square wave with controlled cross points. A clock generator must convert a differential sinusoid signal to a rail-to-rail CMOS clock signal with controllable cross points, regardless of the cross points that are presented in the differential clock signal. FIG. 2 illustrates an example where cross points of differential input signals deviate from an ideal cross-point.

Accordingly, the inventors have identified a need in the art for a clock generator system that can manage duty cycles of a differential input clock and correct for asymmetry in such duty cycles. Moreover, the inventors have identified a need in the art for a clock generator that can detect and manage cross points of a differential input clock and correct such cross points when they deviate from ideal levels.

DETAILED DESCRIPTION

Embodiments of the present system provide a system for correcting duty cycle errors in a clock receiver that may include a differential amplifier that may inputs for a pair of differential clock signals. A duty cycle error detector may have inputs for a pair of amplified clock signals and an output for a duty cycle error correction signal. A signal conditioner may also be provided with the differential amplifier having an input for the duty cycle error correction signal. Furthermore, the signal conditioner may adjust the differential clock signals in response to the duty cycle error correction signal.

Embodiments of the present system also provide a system for correcting cross point errors in a clock receiver that includes a differential amplifier that may have inputs for a pair of differential clock signal. A cross point error detector may have inputs for a pair of amplified clock signals and an output for a cross point error correction signal. A signal conditioner may also be provided with the differential amplifier having an input for the cross point error correction signal. Furthermore, the signal conditioner may adjust the differential clock signals in response to the cross point error correction signal.

Figure 1:
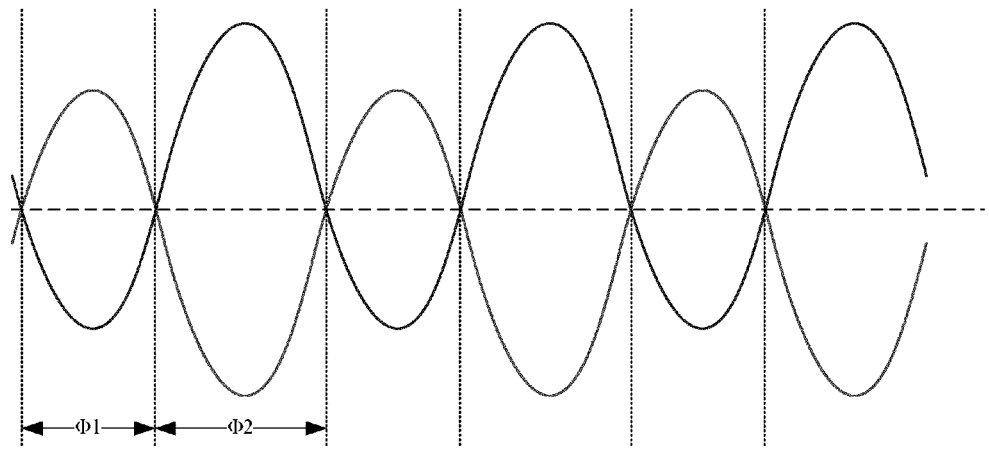
FIG. 1 is an example of differential clock signals with non-ideal duty cycles.
Figure 2:
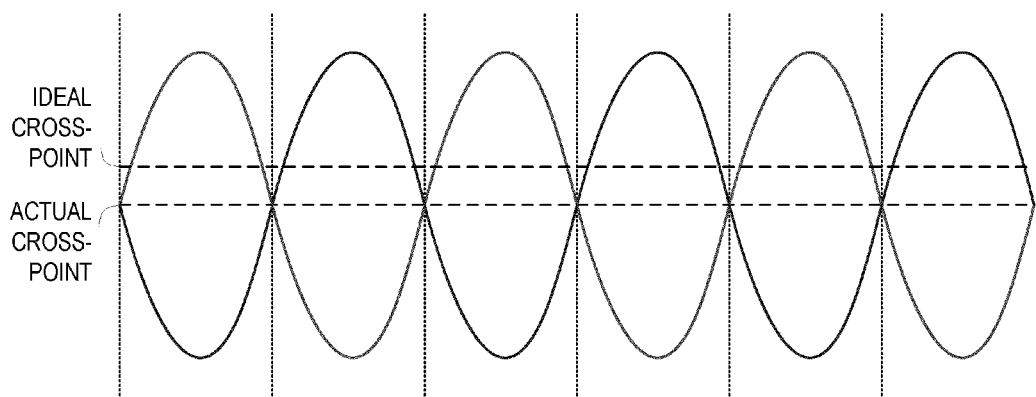
FIG. 2 is an example of differential clock signals with uncontrolled cross points.
Figure 3:
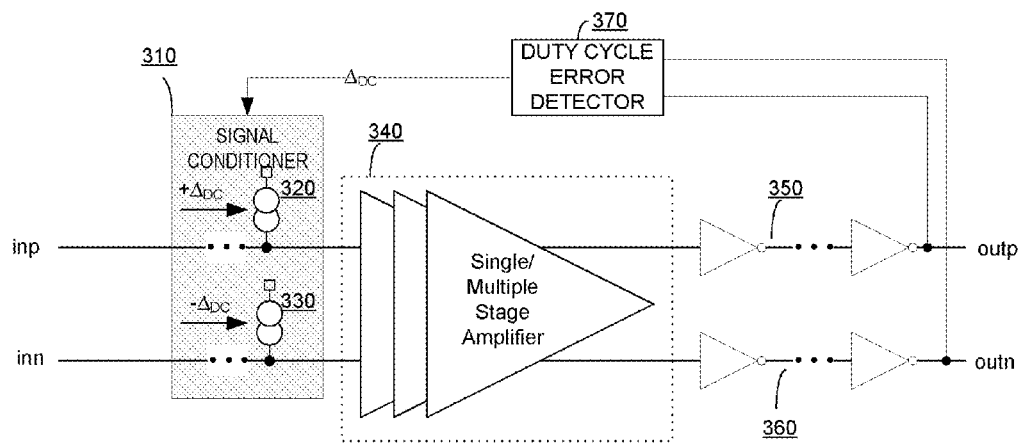
FIG. 3 is a simplified diagram of a clock receiver with duty cycle error correction according to an embodiment.

FIG. 3 is a block diagram of a clock receiver 300 with a duty cycle error correction feedback loop. The clock receiver 300 may include a signal conditioner 310 that has inputs to for a pair of differential clock signals, inp and inn. A signal conditioner may be a processing stage in the clock receiver to shape the clock signals by adjusting signal properties. The signal conditioner may be a separate processing stage in the clock receiver or may be integrated with another processing stage in the clock receiver. The signal conditioner 310 may include current sources 320, 330 for each clock signal. The clock receiver 300 may also include a differential amplifier 340, which may be a single stage or multiple stage differential amplifier. According to an embodiment, the clock receiver may further include inverter stages 350, 360 for each clock signal. The inverter stage may include one or more single ended inverters.

A duty cycle correction feedback loop may be included in the clock receiver 300. A duty cycle error detector 370 may have inputs for the differential clock outputs. The duty cycle error detector 370 may detect an imbalance between the two phases of the differential clock signals and generate a duty cycle error correction signal $\Delta_{DC}$ therefrom. The duty cycle error detector 370 may further have an output for the duty cycle error correction signal $\Delta_{DC}$ that is coupled to signal conditioner 310 to adjust the two current sources 320, 330 in equal but opposite amounts.

Figure 4:
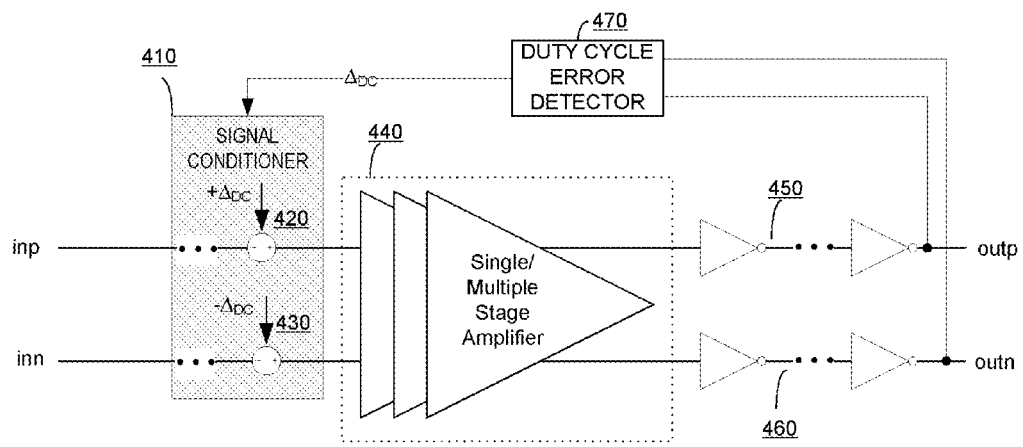
FIG. 4 is a simplified diagram of a clock receiver with duty cycle error correction according to an embodiment.

According to an embodiment, a clock receiver 400 of FIG. 4 may include a signal conditioner 410 with two voltage sources 420, 430 for each clock signal. In this embodiment, the duty cycle error detector 470 may generate a duty cycle error correction signal $\Delta_{DC}$ to adjust the two voltage sources 420, 430 in equal and opposite directions.

Figure 5A:
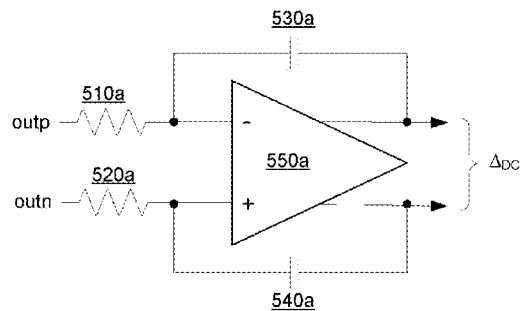
FIG. 5*a* is a simplified diagram of a duty cycle error detector according to an embodiment.

The duty cycle error detector may be implemented as an integrator of various types. FIG. 5a shows an embodiment of the duty cycle error detector 500a implemented as an active RC integrator to generate a differential $\Delta_{DC}$. Duty cycle error detector 500a may include resistors 510a, 520a coupled to the differential clock outputs. The resistors 510a, 520a may also be coupled to capacitors 530a, 540a respectively and to differential amplifier 550a as shown in FIG. 5a to generate a differential $\Delta_{DC}$.

Figure 5B:
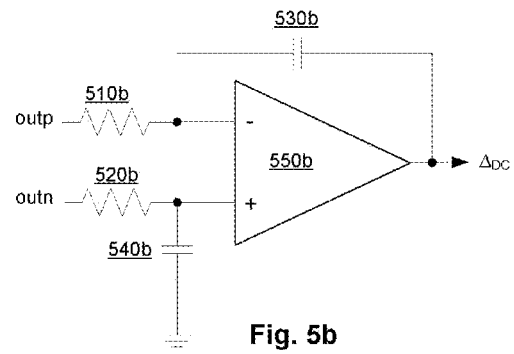
FIG. 5*b* is a simplified diagram of a duty cycle error detector according to an embodiment.

FIG. 5B shows an embodiment of the duty cycle error detector 500b implemented as an active RC integrator to generate a single-ended $\Delta_{DC}$. Duty cycle error detector 500b may include resistors 510b, 510b coupled to the differential clock outputs and a differential amplifier 550b as shown in FIG. 5B. In this embodiment, only the inverting input of differential amplifier 550b may be coupled to the differential amplifier output with capacitor 530b. Capacitor 540b may be coupled to the positive input of the differential amplifier 550b and ground. As a result, duty cycle error detector 500b may generate a single-ended $\Delta_{DC}$.

Figure 6:
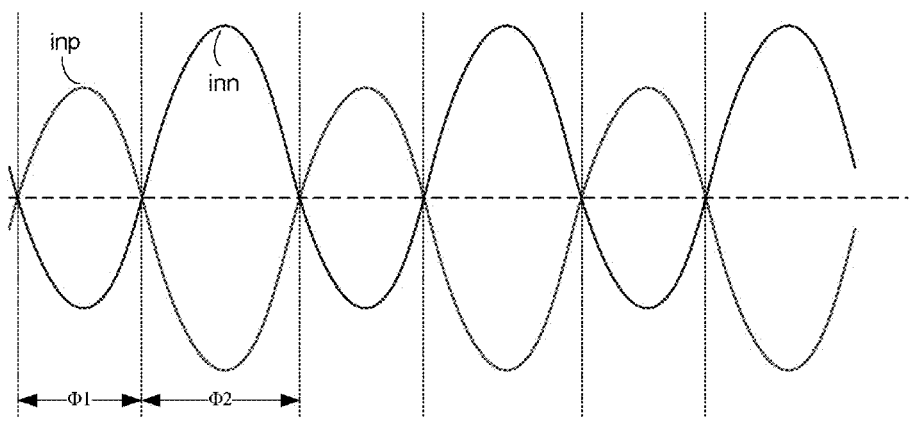
FIG. 6 illustrates an example of differential input clock signals into a clock receiver with duty cycle error correction according to an embodiment.
Figure 7:
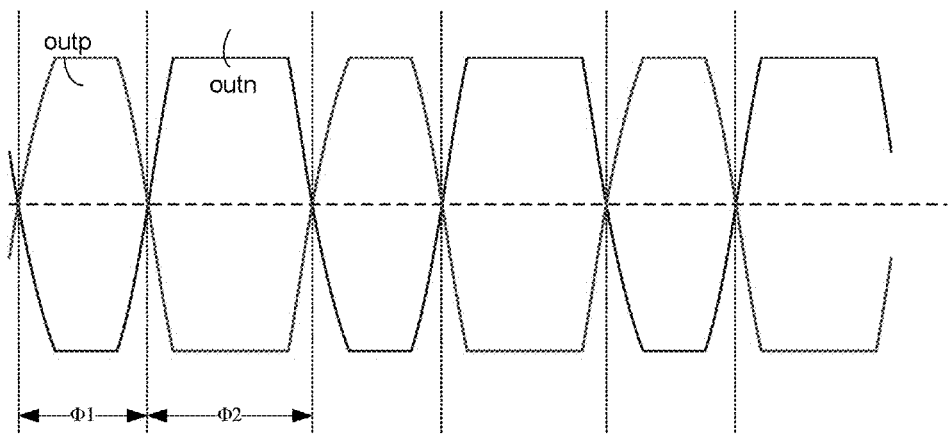
FIG. 7 illustrates an example of differential output clock signals of a clock receiver according to an embodiment.

FIG. 6 illustrates an example of differential clock inputs, inp and inn, into a clock receiver with duty cycle error correction according to the present invention. The two differential clock inputs may be small swing sinusoidal waves with non-ideal duty cycles, $\phi 1$ and $\phi 2$. The differential clock inputs may then be amplified to produce differential clock outputs, outp and outn, of FIG. 7. The differential clock outputs may resemble square waves that are saturated from VDD to ground; hence, the differential clock outputs may resemble rail-to-rail signals. According to an embodiment, the differential clock inputs may also be inverted.

Figure 8:
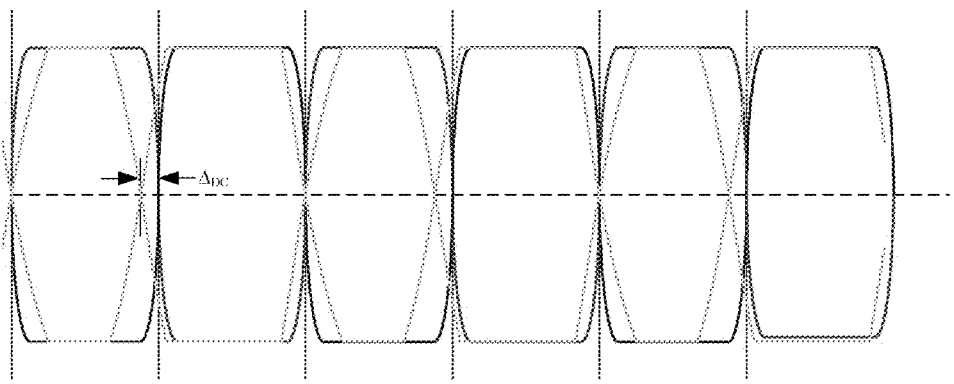
FIG. 8 illustrates an example of duty cycle error detected by a clock receiver according to an embodiment.

The differential clock outputs may be inserted into a duty cycle error feedback loop and inputted into a duty cycle error detector according to the present invention. The duty cycle detector may detect errors in the differential output signals' duty cycles. In this example, duty cycle $\phi 1$ for outp is shorter than the ideal 50% duty cycle while duty cycle $\phi 2$ for outn is longer than the ideal 50% duty cycle. From the errors detected, the duty cycle error detector may generate a duty cycle correction signal $\Delta_{DC}$ as shown in FIG. 8 and may transmit $\Delta_{DC}$ to a signal conditioner. In one embodiment, $\Delta_{DC}$ may be the average voltage (DC component) difference between the two signals where duty cycle errors may cause the averages of the signals to deviate from the ideal value of $V_{DD}/2$. Duty cycle errors may cause one signal's average to be higher than $V_{DD}/2$ while causing the other signal's average to be lower than $V_{DD}/2$.

Figure 9:
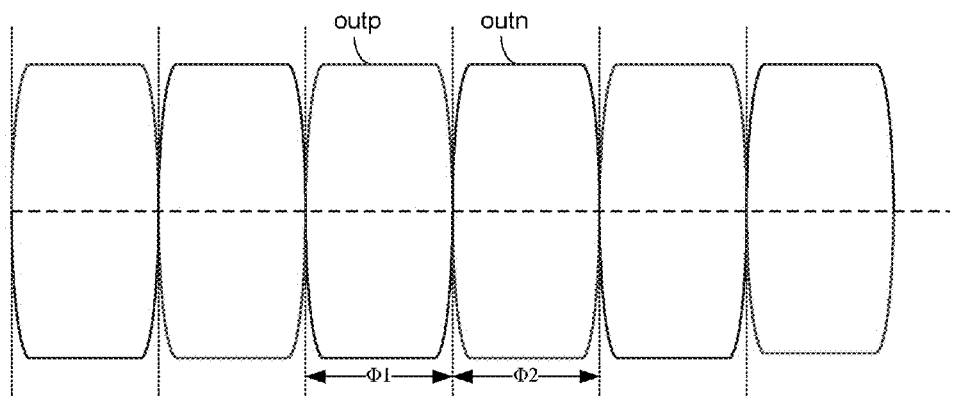
FIG. 9 illustrates an example of adjusted differential output clock signals of a clock receiver according to an embodiment.

The signal conditioner, responsive to $\Delta_{DC}$, may adjust the voltages/currents for differential clock signals accordingly. In this example, the clock signal inp may be adjusted with a positive offset $+\Delta_{DC}$, and the clock signal inn may be adjusted with a negative offset $-\Delta_{DC}$, where both offsets are the same amount. The adjusted clock signals may be processed by the clock receiver and may be inserted into the duty cycle error feedback loop to check for duty cycle errors. The inputs to the duty cycle error detector in this iteration are illustrated in FIG. 9. Here the duty cycles, $\phi 1$ and $\phi 2$, both are at the ideal 50% value. Therefore, no further duty cycle error correction is needed and is $\Delta_{DC}$ stabilized. However, if the duty cycles, $\phi 1$ and $\phi 2$, are not at the ideal 50% value, the duty cycle error detector may generate updated $\Delta_{DC}$s until $\Delta_{DC}$ is stabilized in an iterative process. The differential clock outputs may be continuously monitored even after $\Delta_{DC}$ is stabilized. If a duty cycle error is detected, an updated $\Delta_{DC}$ may be generated and transmitted to the signal conditioner to adjust the differential clock signals in an iterative process until $\Delta_{DC}$ is stabilized again.

Figure 10:
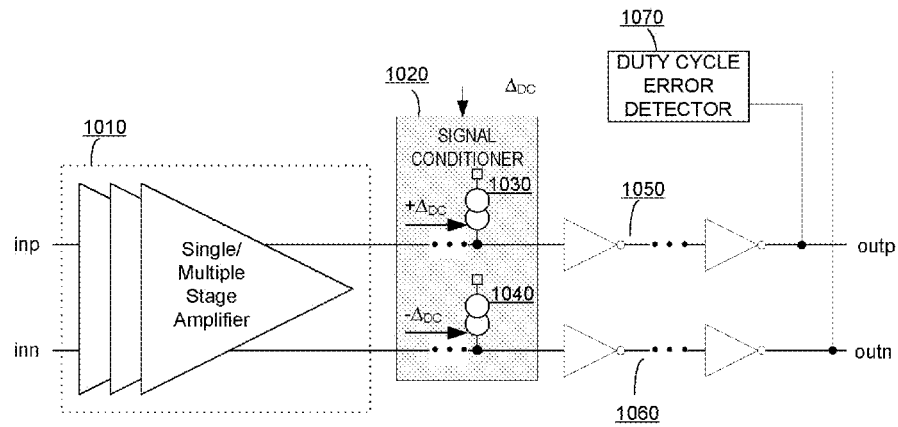
FIG. 10 is a simplified diagram of a clock receiver with duty cycle error correction according to an embodiment.

The signal conditioner that is responsive to $\Delta_{DC}$ may be located in any part of the clock receiver. According to an embodiment, a clock receiver 1000 of FIG. 10 may include a differential amplifier 1010 before a signal conditioner 1020. The differential amplifier 1010 may be a single stage or multiple stage differential amplifiers. The signal conditioner 1020 may include current sources 1030, 1040 for each clock signal; however, voltage sources may alternatively be used instead of current sources. Clock receiver 1000 may also include inverter stages 1050, 1060 according to an embodiment. The inverter stage may include one or more single ended inverters.

A duty cycle error correction feedback loop may be included in the clock receiver 1000. A duty cycle detector 1070 may have inputs for the differential clock outputs. The duty cycle error detector may detect an imbalance between the two phases of the differential clock signals and generate a duty cycle error correction signal $\Delta_{DC}$ therefrom. The duty cycle error detector 1070 may further have an output for the duty cycle error correction signal $\Delta_{DC}$ that is coupled to signal conditioner 1020 to adjust the two current sources 1030, 1040 in equal but opposite amounts.

Figure 11:
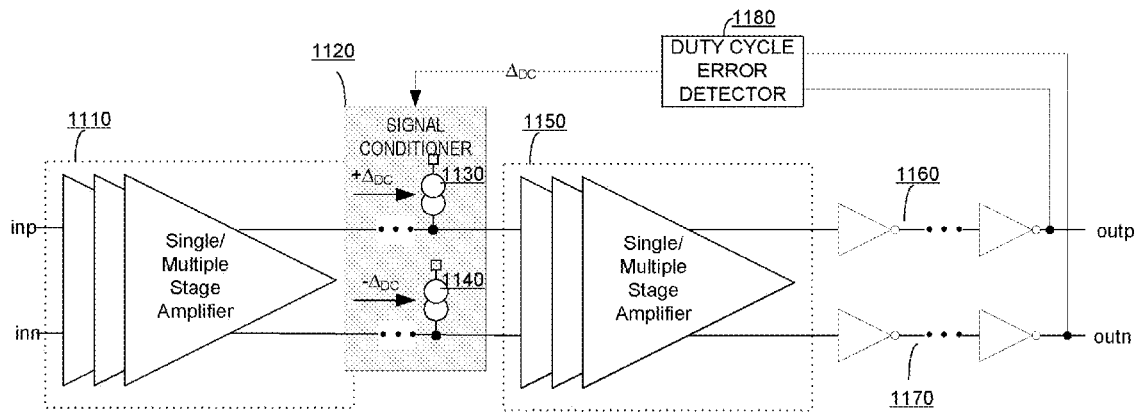
FIG. 11 is a simplified diagram of a clock receiver with duty cycle error correction according to an embodiment.

According to an embodiment, a clock receiver 1100 of FIG. 11 may include a signal conditioner 1120 between two differential amplifiers 1110 and 1150. Each differential amplifier 1110 and 1150 may be a single stage or multiple stage differential amplifiers. The signal conditioner 1120 may include current sources 1130, 1140 for each clock signal; however, voltage sources may alternatively be used instead of current sources. Clock receiver 1100 may also include inverter stages 1160, 1170 according to an embodiment. The inverter stage may include one or more single ended inverters.

A duty cycle error correction feedback loop may be included in the clock receiver 1100. A duty cycle detector 1180 may have inputs for the differential clock outputs. The duty cycle error detector may detect an imbalance between the two phases of the differential clock signals and generate a duty cycle error correction signal $\Delta_{DC}$ therefrom. The duty cycle error detector 1180 may further have an output for the duty cycle error correction signal $\Delta_{DC}$ that is coupled to signal conditioner 1120 to adjust the two current sources 1130, 1140 in equal but opposite amounts.

Figure 12:
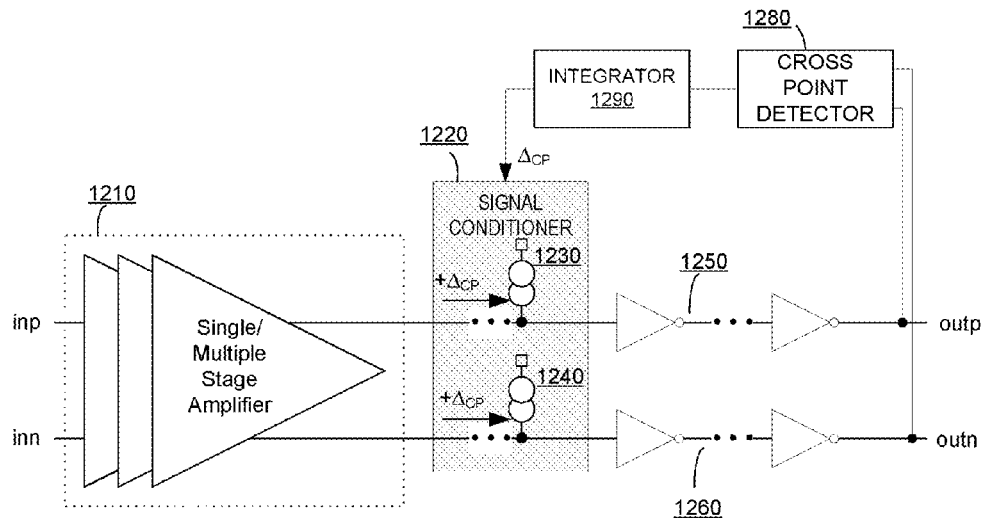
FIG. 12 is a simplified diagram of a clock receiver with cross point error correction according to an embodiment.
Figure 13:
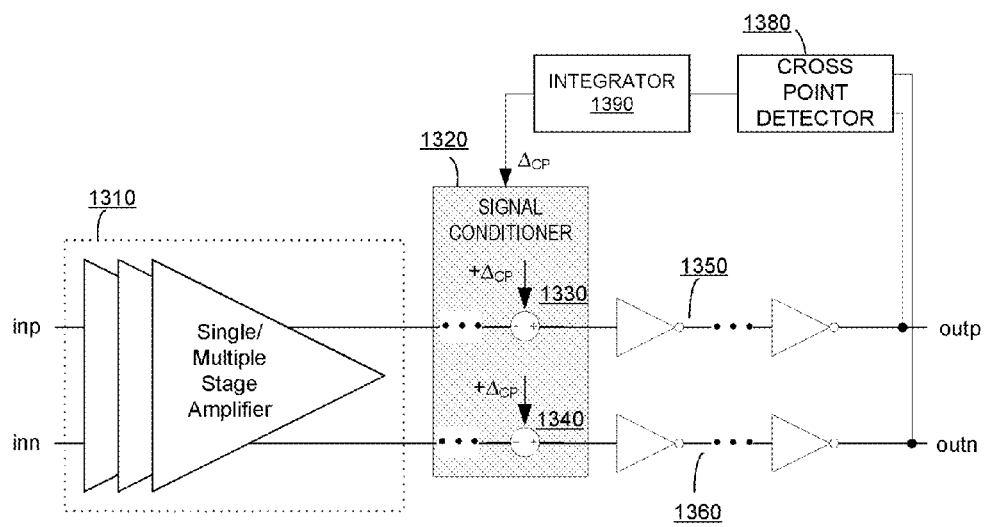
FIG. 13 is a simplified diagram of a clock receiver with cross point error correction according to an embodiment.

FIG. 12 is a block diagram of a clock receiver 1200 with cross point error correction feedback loop. The clock receiver 1200 may include a differential amplifier 1210 that has inputs for a pair of differential clock signals, inp and inn. The differential amplifier may be a single stage or multiple stage differential amplifiers. The clock receiver 1200 may also include a signal conditioner 1230. The signal conditioner 1220 may include current sources 1230, 1240 for each clock signal. According to an embodiment, the clock receiver may further include inverter stages 1250, 1260 for each clock signal. The inverter stage may include one or more single ended inverters.

A cross point correction feedback loop may be included in the clock receiver 1200. A cross point error detector 1280 may have inputs for the differential clock outputs. The cross point detector 1280 may detect the cross points of the two differential clock signals and may send the detection result to an integrator 1290. The integrator 1290 may generate a cross point error correction signal $\Delta_{CP}$ therefrom. The integrator may further have an output for $\Delta_{CP}$ that is coupled to signal conditioner 1220 to adjust the two current sources 1230, 1240 in equal amounts with the same polarity.

According to an embodiment, a clock receiver 1300 of FIG. 4 may include a signal conditioner 1320 with two voltage sources 1330, 1340 for each clock signal. In this embodiment, the cross point error detector 1280 and integrator 1290 may generate a cross point error correction signal $\Delta_{CP}$ to adjust the two voltage sources 420, 430 in equal amounts with the same polarity. A signal conditioner for cross point error correction may not be placed before any differential amplifiers because of the common mode rejection capability of differential amplifiers. Also, a signal conditioner for cross point error correction may not be placed after single-ended inverters because of the common mode gain of the single ended inverters.

Figure 14:
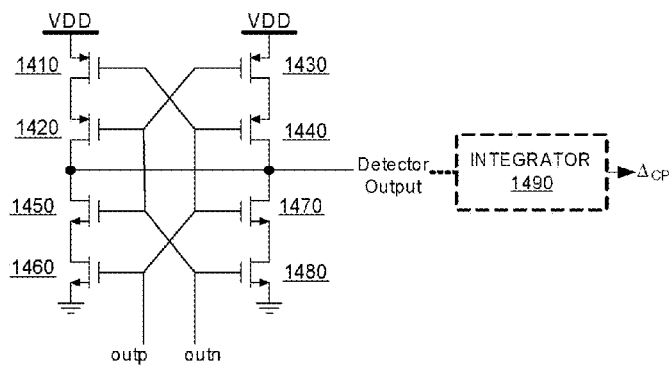
FIG. 14 is a simplified diagram of a cross point error detector according to an embodiment.

FIG. 14 shows an embodiment of a cross point error detector 1400 according to the present invention. Cross point error detector 1400 may include 4 PMOS type transistors 1410, 1420, 1430, 1440 coupled to 4 NMOS type transistors 1450, 1460, 1470, 1480. The first differential clock signal, for example outp, may drive transistors 1410, 1440 and transistors 1460, 1470 by coupling the clock signal to the each of the transistor's gate input. The second differential clock signal, for example outn, may drive transistors, 1420, 1430 and transistors 1450, 1480 by coupling the clock signal to each of the transistor's gate input. The Detector Output of the transistor sets may be integrated by Integrator 1490 to generate $\Delta_{CP}$.

Since PMOS type transistors only conduct when the gate input is low and NMOS type transistors only conduct when the gate input is high, the cross point error detector 1400 may not conduct at most times because the differential clock signals controlling the transistors are usually in a high or low state in opposite relations to each other. However, when the differential clock signals are in their transition region, where neither differential clock signal is either high or low, all transistors may conduct at this time. The transition region also contains the cross points of the two differential clock signals. Therefore, the Detector Output current of FIG. 14 may depend on the cross point of the differential clock signal and size ratio of the PMOS and NMOS type transistors.

The size ratio of the transistors may also define the ideal cross point. For example, PMOS widths may be set wider than NMOS windows resulting in the ideal cross point to be higher than actual cross point because the NMOS transistors would require larger gate voltages to compensate for the narrower window size in order to conduct the same current as the PMOS transistors. Conversely, NMOS widths may be set wider than PMOS windows resulting in the ideal cross point to be lower than the actual cross point. When the Detector Output current of the cross point detector equals zero, the loop stabilizes indicating that the actual cross point is at the ideal cross point.

Cross point error detector 1400 is shown with PMOS type transistors and NMOS type transistors; however, any complimentary transistor types may be used. Also, cross point error detector 1400 is shown with 8 transistors; however, other numbers of transistors may be used. For example, only half of cross point error detector with PMOS transistors 1410, 1420 and NMOS transistors 1450, 1460 with the same configuration as shown in FIG. 14 may comprise the cross point error detector.

Figure 15:
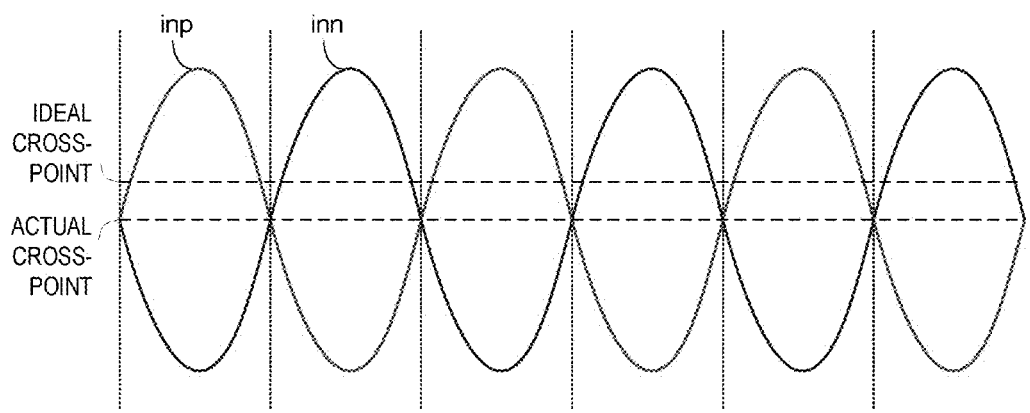
FIG. 15 illustrates an example of differential input clock signals into a clock receiver with cross point error correction according to an embodiment.
Figure 16:
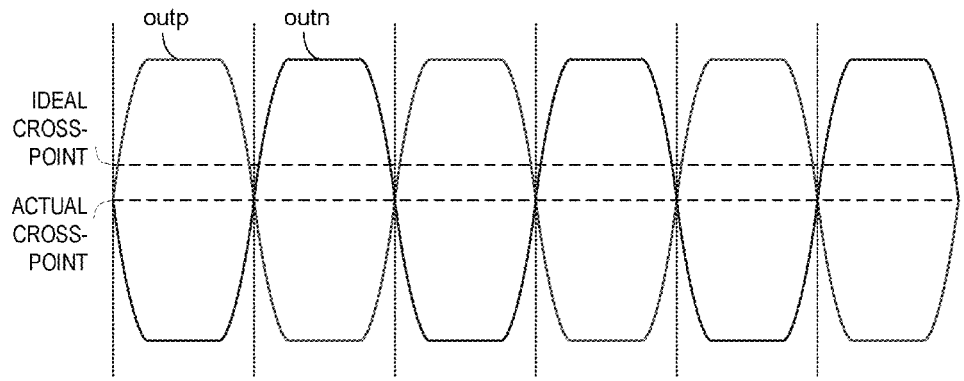
FIG. 16 illustrates an example of differential output clock signals of a clock receiver according to an embodiment.

FIG. 15 illustrates an example of differential clock inputs, inp and inn, into a clock receiver according to the present invention. The two differential clock inputs may be small swing sinusoidal waves with a cross point that deviates from the ideal cross point. The differential clock inputs may then be amplified to produce differential clock outputs, outp and outn, of FIG. 16. The differential clock outputs may resemble square waves that are saturated from VDD to ground; hence, the differential clock outputs may resemble rail-to-rail signals. According to an embodiment, the differential clock inputs may also be inverted.

Figure 17:
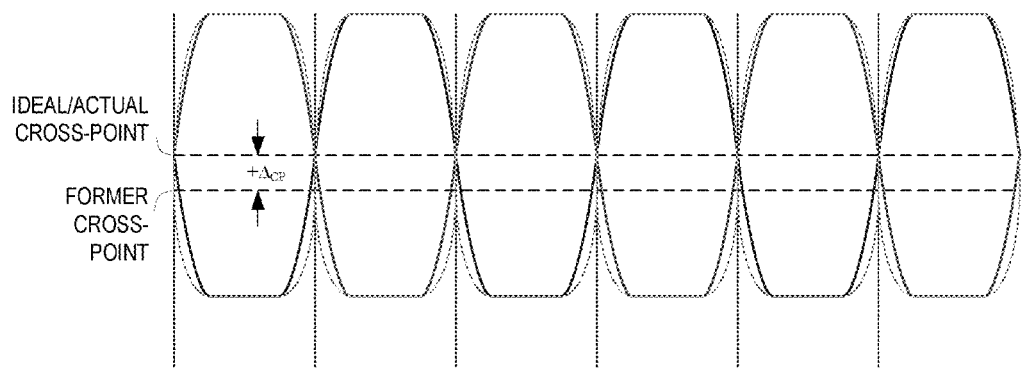
FIG. 17 illustrates an example of cross point error detected by a clock receiver according to an embodiment.

The differential clock outputs may be inserted into a cross point error feedback loop and inputted into a cross point error detector according to the present invention. The cross point detector may detect the cross point of the two differential clock outputs, and the cross point's relation to the ideal cross point. In this example, the actual cross point is lower than the ideal cross point. The cross point error detector and integrator may calculate a cross point error correction signal $\Delta_{CP}$ as shown in FIG. 17 and may transmit $\Delta_{CP}$ to a signal conditioner.

Figure 18:
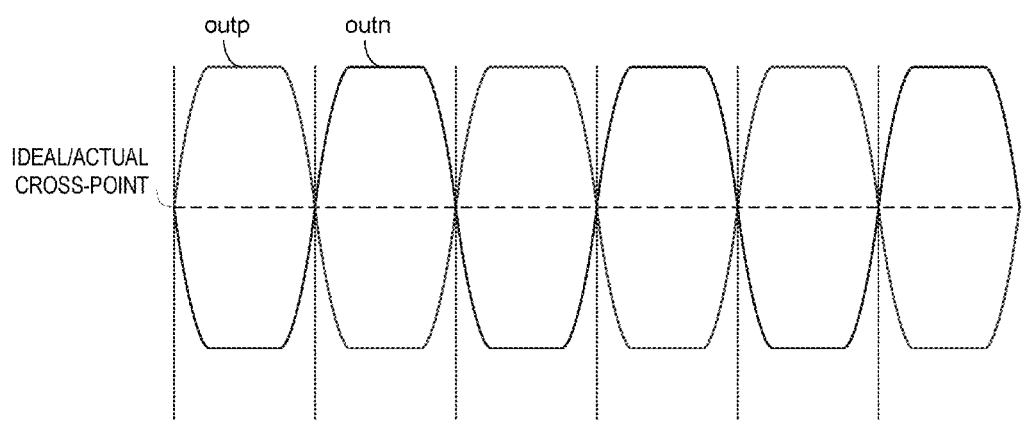
FIG. 18 illustrates an example of adjusted differential output clock signals of a clock receiver according to an embodiment.

The signal conditioner, responsive to $\Delta_{CP}$, may adjust the voltages/currents for differential clock signals accordingly. In this example, both clock signals are adjusted in the positive direction in the same amount. The adjusted clock signals may be processed by the clock receiver and may then be inserted into the cross point error feedback loop to check for the cross point location. The inputs to the cross point error detector in this iteration are illustrated in FIG. 18. Here, the actual cross point of the differential clock signals is at the ideal cross point location. Therefore, no further cross point error correction is needed and $\Delta_{CP}$ stabilized. However, if the actual cross point of the differential clock signals deviates from the ideal cross point location, the cross point error detector may generate updated $\Delta_{CP}$s until $\Delta_{CP}$ is stabilized in an iterative process. The differential clock outputs may be continuously monitored even after $\Delta_{CP}$ is stabilized. If a cross point error is detected at any time, an updated $\Delta_{CP}$ may be generated and transmitted to the signal conditioner to adjust the differential clock signals in an iterative process until $\Delta_{CP}$ is stabilized again.

Figure 19:
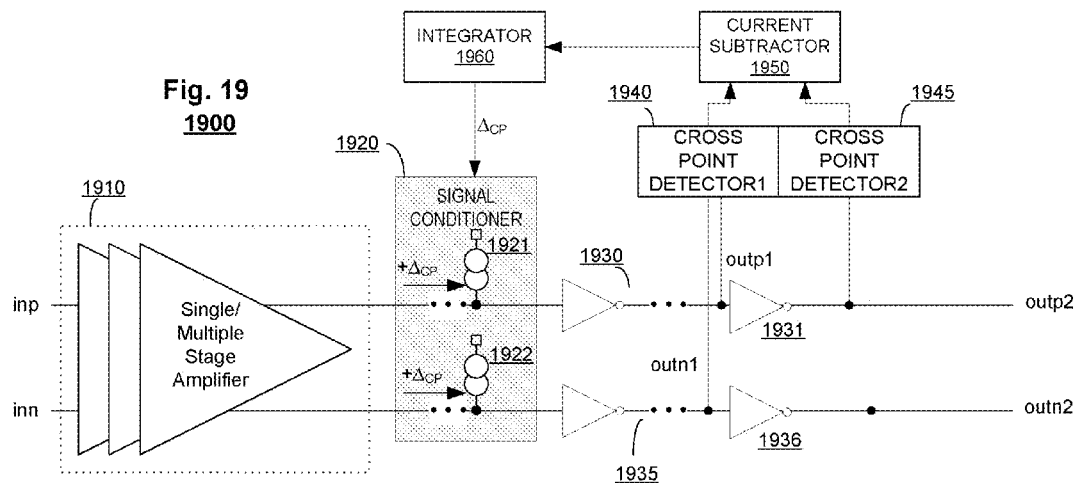
FIG. 19 is a simplified diagram of a clock receiver with cross point error correction according to an embodiment.

According to an embodiment, the clock receiver 1900 of FIG. 19 may include two cross point detectors to balance the cross points at different stages of the clock receiver. Clock receiver 1900 may include differential amplifier 1910 that has inputs for a pair of differential clock signals, inp and inn. The differential amplifier may be a single stage or multiple stage differential amplifiers. The clock receiver may include a signal conditioner 1920 that includes current sources 1930, 1940 for each clock signal; however, voltage sources may alternatively be used instead of current sources. The clock receiver 1900 may further include inverter stages 1930, 1935 for each clock signal. The inverter stage may include one or more single ended inverters.

A cross point correction feedback loop may be included in the clock receiver 1900. Cross point detector1 1940 may detect the cross point of the differential clock signals before the last inverters 1931, 1936 of the inverter stages 1930, 1935 respectively while cross point detector2 1945 may detect the cross point of the differential clock signals after the inverter stages 1930, 1935. The output currents of the cross point detectors 1940, 1945 may be subtracted from each other by current subtractor 1950. Since the amplitude of the cross point detector output currents depend on the cross point deviation, the subtraction result may represent the imbalance of the cross points before and after the last inverter of the inverter stages. If the subtraction result is zero, it may indicate that the cross point before and after the last inverter of the inverter stage are the same. The subtraction result may then be inputted to an integrator 1960 to generate a cross point error correction signal $\Delta_{CP}$ therefrom. The integrator may further have an output for $\Delta_{CP}$ that is coupled to signal conditioner 1920 to adjust the two current sources 1930, 1940 in equal amounts with the same polarity.

Figure 20:
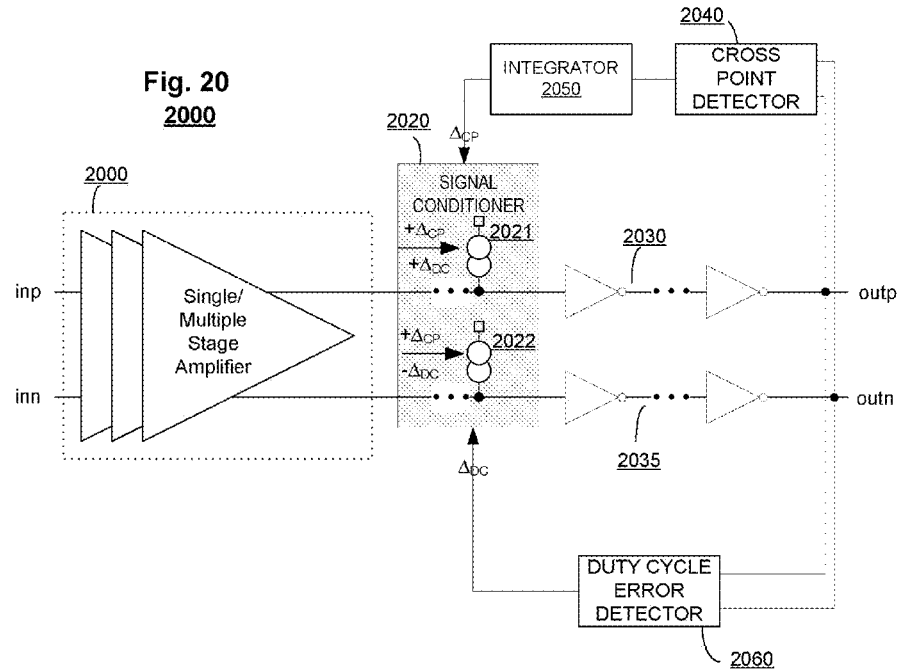
FIG. 20 is a simplified diagram of a clock receiver with duty cycle error correction and cross point error correction according to an embodiment.

Since duty cycle errors and cross point errors are not mutually exclusive and both may cause distortion in the same clock receiver, both duty cycle error correction and cross point error correction may be needed in a clock receiver. Therefore, a clock receiver may include both a duty cycle error correction feedback loop and a cross point error correction feedback loop. According to an embodiment, clock receiver 2000 of FIG. 20 may include differential amplifier 2000 that has inputs to for a pair of differential clock signals, inp and inn. The differential amplifier may be a single stage or multiple stage differential amplifiers. The clock receiver 2000 may also include a signal conditioner 2020 that has inputs for the differential clock signals. The signal conditioner 2020 may include current sources 2021, 2022 for each clock signal; however, voltage sources may alternatively be used instead of current sources. The clock receiver 2000 may further include inverter stages 2030, 2035 for each clock signal. The inverter stage may include one or more single ended inverters.

A duty cycle error correction feedback loop and a cross point correction feedback loop may be included in the clock receiver 2000. A duty cycle error detector 2060 may have inputs for the differential clock outputs. The duty cycle error detector 2060 may detect imbalance between the two phases of the differential clock signals and generate a duty cycle error correction signal $\Delta_{DC}$ therefrom. The duty cycle error detector may further have an output for the duty cycle error correction signal $\Delta_{DC}$ that is coupled to signal conditioner 2020 to adjust the two current sources 2021, 2022 in an equal amount but opposite polarity.

A cross point error detector 2040 may also have inputs for the differential clock outputs. The cross point detector 2040 may detect the cross points of the two differential clock signals and may send the detection result to an integrator 2050. The integrator 2050 may generate a cross point error correction signal $\Delta_{CP}$ therefrom. The integrator may further have an output for $\Delta_{CP}$ that is coupled to signal conditioner 2020 to adjust the two current sources 2021, 2022 in equal amounts with the same polarity.

In this embodiment, signal conditioner 2020 may be shared by both feedback loops; however, each feedback loop may have its own signal conditioner device. A duty cycle signal conditioner may be located in any part of the circuit while a cross point signal conditioner may not be placed before any differential amplifiers and may not be placed after single-ended inverters. If a signal conditioner is shared by both feedback loops, the shared signal conditioner's location may be limited by cross point signal conditioner location restrictions. Also, any duty cycle error correction embodiment of the present invention may be used in conjunction with any cross point error correction embodiment of the present invention. Moreover, both feedback loops may work independently of each other.

It should be understood that the present invention may be utilized in other applications such as signal level shifting of various signal types. These signals may include PECL, LVDS, CML, and pseudo-nmos signals. It should be also understood that the present invention may be operable on range of frequency spectrums such as 100 MHz-5 GHz and above 5 GHz. Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A method to correct cross point errors in a clock receiver, comprising:
   amplifying a pair of differential clock signals;
   detecting cross point errors of the differential clock signals and generating a cross point error correction signal;
   adjusting, as part of the amplifying, the differential clock signals according to the cross point error corrections signal.

2. The method of claim 1, wherein the adjusting comprises shifting the differential clock signals in equal directions based on the cross point error correction signal until the cross point error correction signal indicates no error.

3. The method of claim 1, wherein the adjusting comprises shifting the currents of the differential clock signals.

4. The method of claim 1, wherein the adjusting comprises shifting the voltages of the differential clock signals.

5. The method of claim 1, wherein the amplifying includes multiple stages of amplification.

6. The method of claim 1, further comprising inverting the amplified differential clock signals prior to the detecting.

7. The method of claim 6, wherein the adjusting is performed after the amplifying and before the inverting.

8. The method of claim 1, wherein the detecting comprises:
   driving an active circuit with the differential clock signals to generate an output current; and
   integrating the output current to generate the cross point error correction signal.

9. The method of claim 6, wherein the detecting comprises:
   detecting the cross point of the differential clock signals before a last stage of the inverter stage to generate a first cross point output current;
   detecting the cross point of the differential clock signals after the inverter stage to generate a second cross point output current;
   subtracting the first cross point output current from the second cross point output current to generate a net current flow output; and
   integrating the net current flow output to generate the cross point error correction signal.

10. A clock receiver comprising:
    a differential amplifier having inputs for a pair of differential clock signals;
    a cross point error system having inputs for a pair of amplified differential clock signals and an output for a cross point error correction signal;
    a signal conditioner, provided within the differential amplifier, having an input for the cross point error correction signal, the signal conditioner to adjust the differential clock signals in response to the cross point error correction signal.

11. The clock receiver of claim 10, wherein the signal conditioner shifts the differential clock signals in equal and opposite directions based on the cross point error correction signal until the cross point error correction signal indicates no error.

12. The clock receiver of claim 10, wherein the signal conditioner comprises two current sources to shift the currents of the differential clock signals.

13. The clock receiver of claim 10, wherein the signal conditioner comprises two voltage sources to shift the voltages of the differential clock signals.

14. The clock receiver of claim 10, wherein the differential amplifier comprises multiple amplifiers.

15. The clock receiver of claim 10, further comprising an inverter stage coupled between the differential amplifier and the duty cycle error detector.

16. The clock receiver of claim 15 wherein the signal conditioner is placed after the differential amplifier and before inverter stage.

17. The clock receiver claim 10, wherein the cross point error correction system comprises:
    a cross point error including a first set of transistors and a second set of transistors, and
    an integrator to generate the cross point error correction signal.

18. The clock receiver of claim 17, wherein the first set of transistors is complementary to the second set of transistors.

19. The clock receiver of claim 18, wherein the first set of transistors are PMOS type transistors and the second set of transistors are NMOS type transistors.

20. The clock receiver of claim 15, wherein the cross point error correction system comprises:
    a first cross point detector to detect the cross points of the differential clock signals before a last stage of the inverter stage to generate a first cross point output current;
    a second cross point detector to detect the cross points of the differential clock signals after the inverter stage to generate a second cross point output current;
    a subtractor to subtract the first cross point output current from the second cross point output current to generate a net current flow output current; and
    an integrator to integrate the net current flow output current to generate the cross point error correction signal.

21. A method to correct duty cycle errors and cross point errors in a clock receiver, comprising:
    amplifying a pair of differential clock signals;
    detecting duty cycle errors of the differential clock signals and generating a duty cycle error correction signal therefrom;
    detecting cross point errors of the differential clock signals and generating a cross point error correction signal and
    adjusting, as part of the amplifying, the differential clock signals according to the duty cycle error correction signal and cross point error correction signal.

22. A clock receiver comprising:
    a differential amplifier having inputs for a pair of differential clock signals;
    a duty cycle error detector having inputs for a pair of amplified differential clock signals and an output for a duty cycle error correction signal;
    a cross point error system having inputs for the pair of amplified differential clock signals and an output for a cross point error correction signal;
    a signal conditioner, provided within the differential amplifier, having inputs for the duty cycle error correction signal and the cross point error correction signal, the signal conditioner to adjust the differential clock signals in response to the duty cycle error correction signal and the cross point error correction signal.

* * * * *